(12) United States Patent
Zheng

(10) Patent No.: US 6,475,922 B1
(45) Date of Patent: Nov. 5, 2002

(54) HARD MASK PROCESS TO CONTROL ETCH PROFILES IN A GATE STACK

(75) Inventor: Tammy Zheng, Fremont, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/557,383

(22) Filed: Apr. 25, 2000

(51) Int. Cl.⁷ ............................................. H01L 21/302
(52) U.S. Cl. ........................ 438/725; 438/723; 438/724; 438/717; 438/734; 438/740; 134/1.2; 134/1.3
(58) Field of Search ................................. 438/725, 723, 438/724, 717, 734, 740; 134/1.2, 1.3

(56) References Cited

U.S. PATENT DOCUMENTS

| | | | |
|---|---|---|---|
| 5,320,975 A | * | 6/1994 | Cederbaum et al. .......... 437/44 |
| 5,441,914 A | * | 8/1995 | Taft et al. .................... 437/200 |
| 6,258,727 B1 | * | 7/2001 | Maccagnan .................. 438/714 |
| 6,399,515 B1 | * | 6/2002 | Tao et al. .................... 438/734 |

\* cited by examiner

*Primary Examiner*—George Goudreau
(74) *Attorney, Agent, or Firm*—Peter Zawilski

(57) ABSTRACT

A process increases the etch control on the thin gate oxidation near the edges of a poly-silicon or amorphous silicon gate stack, minimizing the formation of micro-trenches while achieving nearly vertical profiles. In an example embodiment, a method for manufacturing a semiconductor gate stack a gate stack having an anti-reflective coating, has a pattern defined with a photoresist mask The unmasked areas of the gate stack are etched with a first etch. The first etch removes the anti-reflective layer and a majority of the poly or amorphous silicon from the unmasked areas. After the first etch, the photoresist mask is removed. Using the anti-reflective coating as a hard mask the poly or amorphous silicon is removed with a second etch from unmasked areas until the gate oxide exposed. An over etch removes any poly or amorphous silicon residues.

20 Claims, 3 Drawing Sheets

HARD MASK PROCESS TO CONTROL ETCH PROFILES IN A GATE STACK

FIELD OF INVENTION

The present invention is generally directed to the manufacture of a semiconductor device. In particular, the present invention relates to process that increases the etch control on the thin gate oxidation near the edges of a poly-silicon or amorphous silicon gate stack by use of a hard mask.

BACKGROUND OF INVENTION

One important stage in the manufacture of a semiconductor device involves photolithography and etching. In photolithography, The pattern is defined on the wafer substrate. The wafer is then etched. Depending upon the production process, the etching may either be a wet etch in which liquid chemicals are used to remove wafer material or a dry etch in which wafer material is subjected to a radio frequency (RF) induced plasma.

In many modem sub-micron processes, the gate electrode of a transistor is comprised of a composite of layers of materials "stacked" on top of one another, hence the name, "gate stack." A commonly used gate stack is amorphous silicon ($\alpha$-Si) or poly silicon (poly-Si) on top of a thin gate oxide. The $\alpha$-Si or poly-Si is typically doped (by ion implantation) with N-type carriers for NMOS or with P-type carriers for PMOS to minimize poly depletion for NMOS devices and to improve PMOS device characteristics. After the implantation, an organic or in-organic anti-reflection coating (ARC) is deposited on top of the gate stack to reduce reflection for better critical dimension (CD) control on the gate. As IC dimensions are reduced in size, thinner gate oxide is required to maintain an acceptable level of gate capacitance.

Different doping types, doses, and activation levels of the $\alpha$-Si or poly-Si have significant effects on the $\alpha$-Si or poly-Si etch rate as well as the etch profile of the gate stack. N-doped $\alpha$-Si or poly-Si usually etches faster than P-doped $\alpha$-Si or poly-Si in a plasma etch process. Under the N-type material, thin gate oxide may be exposed to the plasma and removed when etching the remaining P-type material after the N-type material has been cleared. A localized breakthrough, "microtrenching," of the thin gate oxidation in the bottom of the $\alpha$-Si or poly-Si etch features can result. Micro-trenches are small trenches formed in the bottom of the $\alpha$-Si features mostly adjacent to the sidewall, and the subsequent rapid etching of the underlying silicon.

With a relatively thin gate oxide, microtrenching is problematic, especially in N-doped areas. In a plasma etch process, a gate etch profile is also very sensitive to the doping of $\alpha$-Si or poly-Si. In addition, the doping characteristics between N-doped and P-doped $\alpha$-Si or poly-Si may be different especially for dense $\alpha$-Si or poly-Si lines. Consequently, there may also be unacceptable critical dimension (CD) variation among gate stacks in dense and sparse areas. Such CD variation in the gate significantly affects the performance of the manufactured devices.

Accordingly, a need exists for a gate etch process that is substantially free of micro-trenching and achieves consistent etch profiles in N/P-type doped gate stacks, as well as good critical dimension control as the process technology approaches fractional microns.

SUMMARY OF INVENTION

The present invention is exemplified in a number of implementations, one of which is summarized below. During the forming of gate stack structures of a transistor, the invention minimizes microtrenching of the thin gate oxide adjacent to the silicon gate structures. Additionally, the invention provides for gate etch profiles which are nearly vertical and consistent across the wafer. In accordance with a first embodiment of the invention, there is a method for etching a gate stack. The gate stack has a hard mask layer formed on a doped silicon layer on an insulating layer, the hard mask layer has a pattern defined thereon; and the pattern has masked areas and unmasked areas on a substrate. The method comprises first etching through unmasked areas of the hard mask layer and a predetermined amount of the doped silicon layer, with a first etch. The masked areas of the pattern are removed. With a second etch, etching of the doped silicon layer is resumed until the insulating layer is exposed. The remaining doped silicon layer is over-etched with a third etch until silicon residues are cleared. An additional feature of this embodiment is that the doped silicon layer may either be a poly-silicon or amorphous silicon. Also, the hard mask layer may be silicon oxynitride or one of a number of materials having similar properties. Additionally, the hard mask layer may serve as an anti reflective coating (ARC).

The above summary of the present invention is not intended to represent each disclosed embodiment, or every aspect, of the present invention. Other aspects and example embodiments are provided in the figures and the detailed description that follows.

BRIEF DESCRIPTION OF THE DRAWINGS

The invention may be more completely understood in consideration of the following detailed description of various embodiments of the invention in connection with the accompanying drawings, in which.

Figure 1:
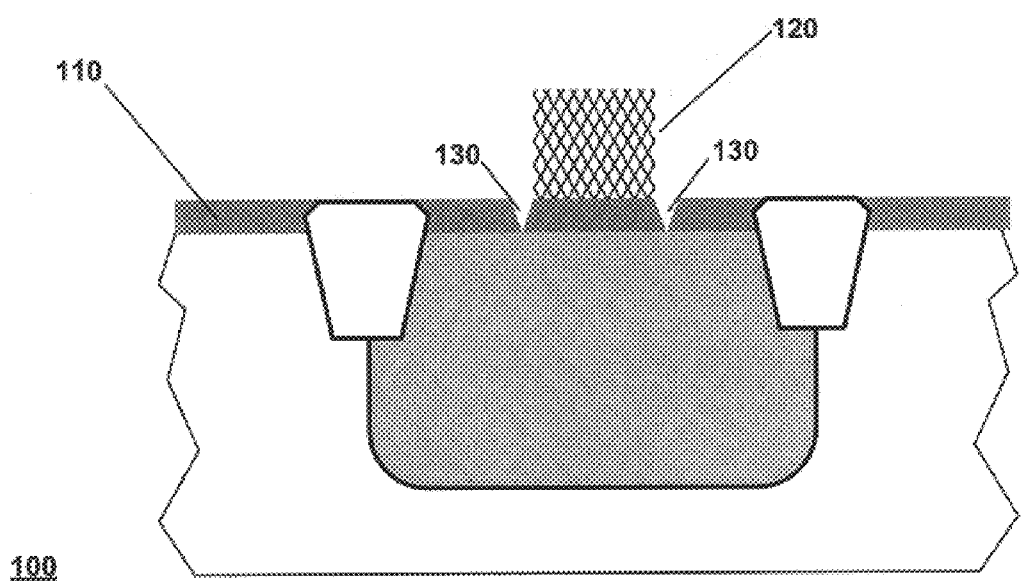
FIG. 1 illustrates according to the prior art, "microtrenching" of the thin gate oxide at the edge of the amorphous or poly-silicon gate stack of a MOS transistor after gate stack etch.

While the invention is susceptible to various modifications and alternative forms, specific embodiments thereof have been shown by way of example in the drawings and will herein be described in detail.

DETAILED DESCRIPTION

The present invention has been found to be useful and advantageous in connection with etching processes used to manufacture MOS-type transistors. The present invention has been found to be particularly useful where it is difficult to control the etch profile in a gate stack. It assures that the underlying thin oxide layer is not attacked during the etching. In the discussion that follows, a MOS structure is used to describe an example implementation of the invention. However, the invention is not necessarily limited.

FIG. 1 depicts an example NMOS transistor device 100 built with a modem sub-0.25 µm process. Due to plasma etching, a thin gate oxide region 110 exhibits microtrenching 130 near the bottom and adjacent to an N-doped (or P-doped) α-Si or poly-Si region 120 that covers the gate of the transistor device. Since the gate oxide can be in the range of approximately 25 Å to 100 Å, microtrenching affects the characteristics of the CMOS transistor gate and ultimately degrades the performance. Such degradation of performance affects yield and reliability and can result in increased processing costs.

In a conventional process, the sequence of etching the gate begins with etching the hard mask, stripping the resist, and then etching the poly silicon gate. In contrast, the present invention relies on using and retaining the photo mask during etch of the hard mask material and most of the doped α-Si or poly-Si. The hard mask is usually comprised of an anti-reflective coating (ARC). After most of the α-Si or poly-Si is etched, the resist is then removed. Consequently, a thinner hard mask may be used.

To address the microtrenching of the thin oxide and to achieve a consistent profile in an example process according to the present invention, the process begins with the deposition of N-doped (or P-doped) α-Si or poly-Si followed by an inorganic ARC (e.g., SiON) deposition. In another example process according to the present invention, the α-Si or poly-Si may be undoped initially and later implanted with N-type or P-type species, then followed by an ARC deposition. The gate regions are defined through conventional photolithography. After masking, the gate regions are etched.

The amount of oxygen in the etch influences the $Si/SiO_2$ selectivity. The higher the, $O_2$ amount, the greater the selectivity. In an example etch process, carbon in the photo resist consumes the oxygen introduced into the etch and results in lower selectivity.

Wafers are placed into an etch apparatus. A first etch comprising a breakthrough etch and a bulk etch removes the unmasked ARC (Anti-Reflective Coating) and the majority (about 60–70%) of the α-Si or poly-Si. The two etches usually have low selectivity. They define anisotropic profiles for the gate stack. During these two etch stages, the photoresist mask protects the desired features.

The wafers are removed from the etch apparatus after the breakthrough and bulk etch. With a plasma ashing, a wet clean process or a combination of both, the photoresist is stripped off.

Wafers are reintroduced into the etch apparatus. Using a second etch, which may be identical to the first, a quick breakthrough etch first removes any native oxide that may have grown on the α-Si or poly-Si. Next, a high-selectivity endpoint etch removes the Si and stops on the thin oxide. The hard mask protects the desired features, assures very high selectivity and consistent profiles. An over-etch removes any residual Si.

The process according to the present invention achieves profiles that are more anisotropic and near about 90° for an oxide thickness of less than about 40 Å but without microtrenching. The afore-mentioned process may be further understood by referring to FIGS. 2A–2B.

Figure 2A:
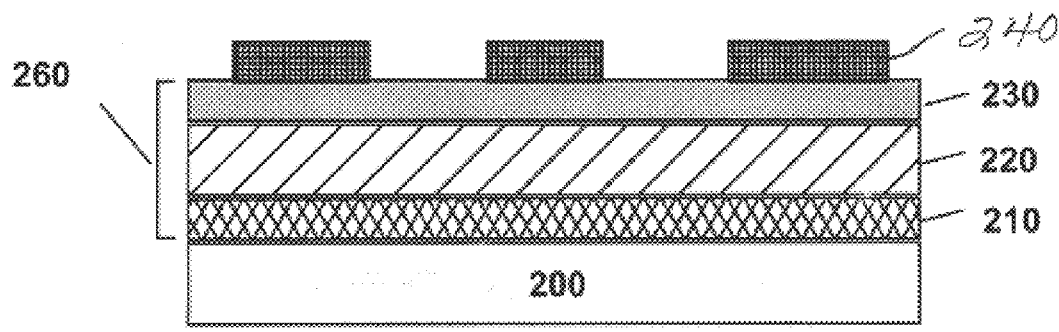
FIG. 2A is a cross-sectional view of a substrate after photo masking but before etch according to an embodiment of the present invention.

Refer to FIG. 2A. In attaining the straight wall profile, the substrate 200 may be metal, glass, or ceramic. Typically, the substrate 200 is a semiconductor wafer of silicon or gallium arsenide. Upon the substrate 200, there is a plurality of layers 260, a lower layer 210, a middle layer 220, and an upper layer 230. The layers may include oxide, nitride, and silicide layers. For example, the process according an example embodiment of the present invention may be applied to a gate structure of a MOS transistor. The lower layer 210 may be an oxide or other suitable dielectric, the middle layer 220, poly-silicon or amorphous-silicon, and the upper layer 230 may be a ARC layer. In defining the desired features, a resist mask 240 is applied on the ARC layer 230. The pattern defined by the resist mask 240 has masked areas and unmasked areas. With a first etch, unmasked areas of the ARC layer 230 are etched through and a predetermined amount of the middle layer 220 is removed. Depending upon the process, a majority of the middle layer may be removed. One example process applying the present invention may remove the majority, 50% to 80% of the middle layer 220 poly or amorphous silicon.

Materials suitable for the ARC layer 230 typically have low reflectivity of light for the wavelength range used to form the pattern. Therefore, the particular materials useful for forming the ARC layer 230 depend on the size of the features and the design rules. For 0.25 µm design rules, titanium nitride is a useful material for the ARC layer 230. Other suitable materials for the ARC layer 230 include, for example, silicon oxynitride, silicon nitride, silicon dioxide, and organic ARC materials. Although the ARC material may be non-conductive, it is often desirable to use a conductive ARC Otherwise, with additional process steps, the non-conductive ARC material needs to be removed to allow connection between the gate stack structure 260 (FIG. 2B) and subsequently formed interconnects or contacts. For a salicide process, the non-conductive ARC is removed to enable formation of a refractory metal salicide on the gate. For example, titanium may be used to form the titanium silicide on the gate. Other refractory metals include cobalt, tungsten, and molybdenum.

Figure 2B:
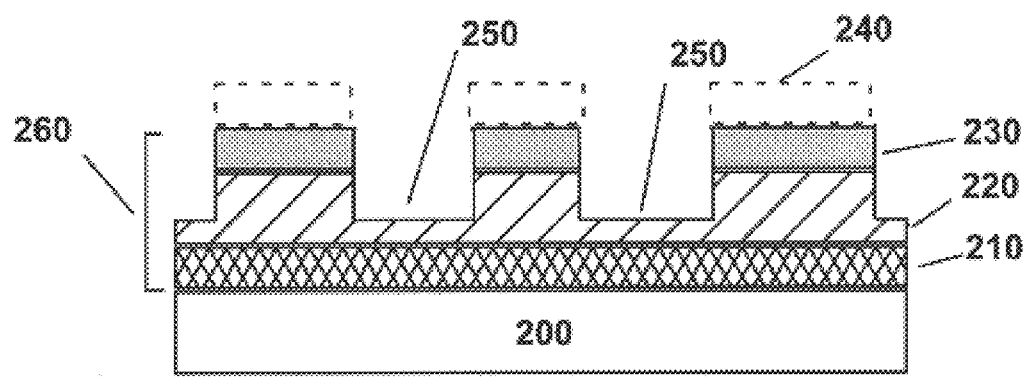
FIG. 2B is cross-sectional view of a substrate of FIG. 2A after etching about through the anti-reflective coating layer and into the majority of the $\alpha$-Si or poly-Si according an embodiment of the present invention.

Refer to FIG. 2B. The unmasked areas of the substrate 200 have been etched. Selected portions of the ARC layer 230 have been removed and the majority of the α-Si or poly-Si layer 220 has been etched in the unmasked areas 250. After the first etch, the photo resist 240 that masked areas of the defined pattern, is removed. With a second etch, etching is resumed on substrate 200 where the ARC layer 230 serves as a hard mask to retain the desired features first defined by photoresist mask 240. The second etch continues until the lower layer 210 of insulating layer is exposed. A third etch over-etches any remaining middle layer 220 of poly or amorphous silicon until no residues remain.

Figure 2C:
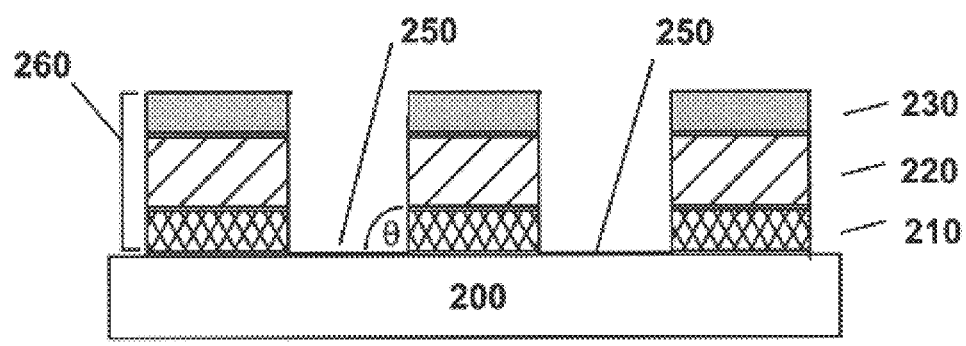
FIG. 2C is a cross-sectional view of the substrate of FIG. 2B after the $\alpha$-Si or poly-Si has been etched to expose the thin oxide.

Refer to FIG. 2C The hard mask material 230 protects the underlying layers from etch. The middle layer 220 of poly-silicon and the lower layer 210 of oxide are etched down to the substrate 200 in the unmasked regions 250. The remaining features 260 have sidewalls that form an angle θ in the range of about 85° to 90° with respect to the substrate 200. These features 260 are part of specific portions of the semiconductor device being built. The features have lengths in the range of about 0.20 µm to 2 µm. Of course, as the process technology evolves the feature sizes decrease. In addition, the features may be "dense" or closely packed on the substrate with spans among the features being about 0.3 µm to about 30 µm wide.

Figure 3:
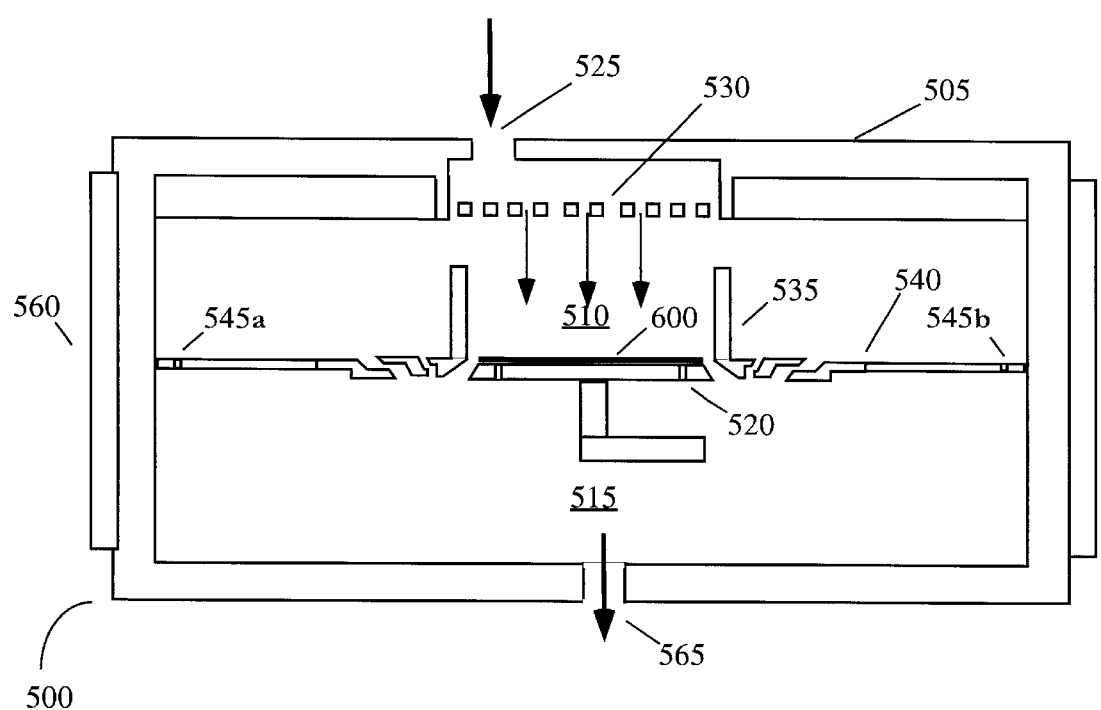
FIG. 3 is a cross-sectional view of an apparatus suitable for performing plasma etching according to the present invention.

Refer to FIG. 3. An embodiment according to the present invention is applied to an example etch apparatus providing a suitable etching environment. Etching of the poly-Si (α-Si) typically takes place in a plasma etch apparatus 500. The etch apparatus 500 includes an etch chamber 505. Inside there is an etch zone 510 and a non-etch zone 515. A wafer 600 that may contain multiple substrates 200 as depicted in the series of FIGS. 2A–2C, is placed on a cathode in the etch chamber 505. Through a gas inlet 525, process gas is introduced into the etch chamber 505. Controls (not illustrated) upstream from the gas inlet 525 blend the constituent mixture of the process gas for a given etch chemistry. The composition of the process gas is controlled by adjusting the volumetric flow ratios of the constituent reactive gases. Volumetric flow ratio is defined as the ratio of the volume per unit time of one gas to the volume per unit time of a second gas. Typically, this is expressed as "standard cubic centimeters per minute" (sccm).

After flowing through the gas inlet 525, the process gas passes through a diffuser plate 530 which distributes the process gas in the etch zone 510. A focus ring 535 may be used to substantially contain the plasma in the etch zone 510. The plasma forms an etch gas from the process gas.

A barrier or pumping plate 540 having exhaust holes 535*a* and 535*b* separates the etch chamber 505 into an etching zone 510 and a non-etching zone 515. The exhaust holes 435*a* and 435*b* are in fluid communication with a vacuum pump through the exhaust hole 565 for withdrawing spent process gas and volatile etch-byproduct compounds from the etching chamber 505. In some apparatus, the user may activate a magnetic coil 560 to enhance the plasma formed in the etching zone 510.

In a modem example process, the configuration of the etching apparatus enables the user significant flexibility in controlling etching. A number of different configurations of plasma etch apparatus exist in the art. For example when etching the multiple layers 210, 220 and 230 of FIGS. 2A–2C, the process usually has multiple stages.

The process conditions for each stage depends upon the composition of layer that is being etched. Furthermore, when the wafer 600 is etched in multiple stages, the progress of the etch in one type of chamber, may observed by monitoring certain wavelengths of the plasma therein. When the intensity of the wavelength changes, it indicates that one layer has been etched through and the next layer is being etched. During the changeover, the composition of the process gases and other process parameters may be changed to provide different etch results (i.e., different etch rates, selectivity, and profiles). A number of techniques to indicate "an end of etch" are known in the art. In one technique, the optical emission of the plasma is measured to determine its composition.

In the example process according to the present invention, the volumetric flow ratio of the constituent process gases is selected so that the sidewalls 260 of the features defined by mask layer 230 of FIG. 2C forms an angle θ of at least about 85° with the substrate 200. The ratio may be selected so that the sidewalls 260 form an angle θ in the range of about 85° to 90° with the substrate 200. Features defined at 260 having perpendicular sidewalls are desirable for integrated circuit design and performance.

Tables 1 and 2 illustrate the etch recipes in an example process according to the present invention. The etcher used is a Lam Research, Model 9400SE.

TABLE 1

Gate Stack Etch with Photo Mask

|  | Stage 01 | Break-through Stage 02 | Stage 03 | Bulk Stage 04 |
|---|---|---|---|---|
| Pressure (mT) | 10.00 | 10.00 | 5.00 | 5.00 |
| RF-Top (W) | 0.0 | 350.0 | 0.0 | 200.0 |
| RF-Bottom (W) | 0.0 | 50.0 | 0.0 | 60.0 |
| Gap (cm) | 8.100 | 8.100 | 8.100 | 8.100 |
| Cl2 (sccm) | 0.0 | 0.0 | 15.0 | 15.0 |
| HBr (ssm) | 0.0 | 0.0 | 90.0 | 90.0 |
| 80% He—O2 (sccm) | 0.0 | 0.0 | 0.0 | 0.0 |
| CF4 (sccm) | 100.0 | 100.0 | 12.0 | 12.0 |
| He (sccm) | 0.0 | 0.0 | 0.0 | 0.0 |
| SF6 (sccm) | 0.0 | 0.0 | 0.0 | 0.0 |
| O2 (sccm) | 0.0 | 0.0 | 0.0 | 0.0 |
| N2 (sccm) | 0.0 | 0.0 | 0.0 | 0.0 |

TABLE 1-continued

Gate Stack Etch with Photo Mask

| He clamp (T) | 8.0 | 8.0 | 8.0 | 8.0 |
|---|---|---|---|---|
| Completion | Stabl | Time | Stabl | Time |
| Time | 30 | 24 | 30 | 50 |
| Channel |  |  |  | A |
| Delay (sec) |  |  |  |  |
| Norm (sec) |  |  |  |  |
| Trigger (%) |  |  |  |  |

Temperatures (° C.)

Bottom Electrode 65.0
Chamber 60.0

| Channel | Wavelength (nm) |
|---|---|
| A | 405 |
| B | 520 |

| MFC | Gas | sccm |
|---|---|---|
| 1 | Cl2 | 200 |
| 2 | HBr | 200 |
| 3 | 80% He—O2 | 20 |
| 4 | CF4 | 200 |
| 5 | He | 200 |
| 6 | SF6 | 100 |
| 7 | O2 | 100 |
| 8 | N2 | 50 |

Refer to Table 1. The "Breakthrough Etch" at Stage 01 begins with loading wafers, whose desired features have been protected by a photo resist mask, into an etching chamber, the control systems connected to the chamber pump it down to vacuum conditions. The electrode temperatures is maintained at about 65° C. and the chamber temperature is maintained at about 60° C. throughout the process. Approximately 30 seconds are required to achieve stable process conditions. During those 30 seconds the first process gas, $CF_4$ is introduced into the chamber at a flow rate of about 100 sccm and a pressure of 10 mT. The ignition gap has been to about 8.1 cm The gap is the spacing between the upper and lower electrode of the plasma etcher. Going to Stage 02, the chamber powers up. The RF-top power and RF-bottom power are about 350 watts and 50 watts, respectively. The $CF_4$-based plasma etches any SiON ARC on the surface of the (α-Si (poly-Si)) for about 24 seconds.

In setting the power for the etch process, the RF-top power is the source power for the plasma and it controls the plasma density. The RF-bottom power is the bias power and it controls the ion energy of the plasma. For about 25 seconds, the $CF_4$-based plasma etches any SiON ARC and any native oxide on the surface of the α-Si (poly-Si). The wafers are held down on the chuck by electrostatic force. Backside helium, maintained at a pressure of about 8 Torr, allows for wafer temperature control.

The "Bulk Etch" of the SiON ARC and α-Si (poly-Si) uses $Cf4/HBr/Cl_2$ to etch the heavily N-doped and P-doped α-Si (poly-Si) with a low $Si:SiO_2$ etch selectivity but with the 85°–90° profile. About 60%–70% of the (α-Si (poly-Si)) is etched at this point. Etch parameters are set in Stage 03. The chamber pressure is about 5 mT. The process gas is a mixture of about 15 sccm of $Cl_2$, about 90 sccm of HBr, and about 12 sccm of 80%He—$O_2$. After about 30 seconds for the pressure and gas flows to stabilize, the bulk etch at Stage 04 begins. The bulk etch runs for about 50 seconds at a RF-top power and RF-bottom power of about 200 watts and 60 watts, respectively.

After the above etch, the photo resist mask is removed. In one example process, the wafers are removed from the etch chamber so that the photo resist may be stripped off by plasma ashing (in an $O_2$ plasma) or a solvent strip. In another example process, if the equipment is capable, the resist mask may be removed in situ with an oxygen plasma. After this oxygen plasma, the gate stack is etched with the SiON hard mask Refer to Table 2 "Gate Stack Etch Ha Mask." After removing the photo mask, the wafers are then put back into the plasma etcher to etch the remaining α-Si (poly-Si) and stop on the thin gate oxide. High selectivity is obtained by using SiON has a hard mask. For example, to etch 500 Å of Si with a 30% over etch margin and with a selectivity over 200:1 at the endpoint and over etch steps, the total SiON consumption may be less than 5 Å.

α-Si (poly-Si) is etched in the same was as was done in Table 1, Stages 03–04. However, rather than being timed, the etch is set to stop when the underlying thin oxide is exposed, the "endpoint.". The "Endpoint" etch parameters are set and performed as outlined in Table 2, Stages 07–08.

In one example process for a given etch chemistry, the RF-bottom power (bias power) may range from about 5 watts to about 150 watts. The RF-top (source) power may range from about 50 watts to about a 1000 watts. The amount of power is adjusted to achieve the desired gate stack profile. Optical emission detectors shown in Tables 1 and 2, as Channel A and B are used to measure and trigger the end of etch signal endpoint. In this example process, however, only Channel A is used to measure the 405 nm endpoint

TABLE 2

Gate Stack Etch with Hard Mask

|  | Stage 05 | Breakthrough Stage 06 | Stage 07 | Endpoint Stage 08 | Stage 09 | Over Etch Stage 10 | Stage 11 | Stage 12 |
|---|---|---|---|---|---|---|---|---|
| Pressure (mT) | 10.00 | 10.00 | 20.00 | 20.00 | 80.00 | 80.00 | 90.00 | 0.00 |
| RF-Top (W) | 00 | 350.0 | 0.0 | 150.0 | 0.0 | 250.0 | 0.0 | 0.0 |
| RF-Bottom (W) | 00 | 50.0 | 0.0 | 30.0 | 0.0 | 70.0 | 0.0 | 0.0 |
| Gap (cm) | 8.100 | 8.100 | 8.100 | 8.100 | 8.100 | 8.100 | 8.100 | 8.100 |
| Cl2 (sccm) | 0.0 | 0.0 | 10.0 | 10.0 | 0.0 | 0.0 | 0.0 | 0.0 |
| HBr (ssm) | 0.0 | 0.0 | 150.0 | 150.0 | 200.0 | 200.0 | 0.0 | 0.0 |
| 80% He—O2 (sccm) | 0.0 | 0.0 | 15.0 | 15.0 | 0.0 | 10.0 | 0.0 | 0.0 |
| CF4 (sccm) | 100.0 | 100.0 | 0.0 | 0.0 | 0.0 | 0.0 | 0.0 | 0.0 |
| He (sccm) | 0.0 | 0.0 | 0.0 | 0.0 | 200.0 | 200.0 | 200.0 | 0.0 |
| SF6 (sccm) | 0.0 | 0.0 | 0.0 | 0.0 | 0.0 | 0.0 | 0.0 | 0.0 |
| O2 (sccm) | 0.0 | 0.0 | 0.0 | 0.0 | 0.0 | 0.0 | 0.0 | 0.0 |
| N2 (sccm) | 0.0 | 0.0 | 0.0 | 0.0 | 0.0 | 0.0 | 0.0 | 0.0 |
| He clamp (T) | 8.0 | 8.0 | 8.0 | 8.0 | 80 | 80 | 0.0 | 0.0 |
| Completion | Stabl | Time | Stabl | EndPt | Stabl | Time | Time | End |
| Time | 30 | 5 | 30 | 150 | 30 | 60 | 7 |  |
| Channel |  |  |  | A |  |  |  |  |
| Delay (sec) |  |  |  | 50 |  |  |  |  |
| Norm (sec) |  |  |  | 2 |  |  |  |  |
| Trigger (%) |  |  |  | 98 |  |  |  |  |

Temperatures (° C.)

Bottom Electrode 65.0
Chamber 60.0

| Channel | Wavelength (nm) |
|---|---|
| A | 405 |
| B | 520 |

| MFC | Gas | sccm |
|---|---|---|
| 1 | Cl2 | 200 |
| 2 | HBr | 200 |
| 3 | 80% He—O2 | 20 |
| 4 | CF4 | 200 |
| 5 | He | 200 |
| 6 | SF6 | 100 |
| 7 | O2 | 100 |
| 8 | N2 | 50 |

The "Gate Stack Etch Hard Mask" process etches the remaining α-Si (poly-Si) and stops on the very thin gate oxide. The step consuming most of the SiON ARC during the hard mask etch process is the "Breakthrough" step which is needed to remove any native oxide Less than about 20 Å) on top of the α-Si (poly-Si). About 60 Å of SiON may be removed. However, the process applies about 270 Å of SiON so that about 200 Å remains.

The parameters are set at Stage 05. These parameters are the same as those outlined in Table 1, Stage 01. At Stage 06, the "Breakthrough" etch runs for about 5 seconds as was done in Table 1, Stage 02. After the "Breakthrough" etch, the signal. A delay time is set to about 50 seconds. "Delay" means the time from the beginning of this step for which the endpoint signal is ignored (or after this time, starts sampling and evaluating the optical endpoint signal). "Norm" is after the delay has elapsed, the endpoint signal is sampled and then averaged to establish a normalized (100%) value. Norm specifies the duration of this sampling. The "trigger" specifies the percentage of the normalized value at which endpoint indication happens. Its value may be greater or less than 100% and triggers either on a rising or falling endpoint signal.

An "Over Etch" at Stages 09–10 removes any α-Si (poly-Si) residues. The chamber pressure is about 80 mT. The process gas is a mixture of about 200 sccm of HBr, about 10 sccm of 80%He—$O_2$. and about 200 sccm of He. After about 30 seconds for the pressure and gas flows to stabilize, the over etch at Stage 10 begins. The over etch runs for about 60 seconds at an RF-top power and RF-bottom power of about 250 watts and 70 watts, respectively.

At Stage 11, RF power is turned off and the chamber is purged with He at a pressure of about 90 mT for 7–10 seconds. At Stage 12, chamber is deactivated and wafers are removed for subsequent processing.

Achieved by the above process are gate profiles that are consistent across the device, nearly vertical, and substantially free of microtrenching. Consequently, the quality of the transistor structures attained is increased resulting in higher yields and lower product costs.

While the present invention has been described with reference to several particular example embodiments, those skilled in the art will recognize that many changes may be made thereto without departing from the spirit and scope of the present invention, which is set forth in the following claims.

What is claimed:

1. A method for etching a gate stack having a hard mask layer formed on a doped silicon layer on an insulating layer on a substrate, the hard mask layer having a pattern defined thereon, the pattern having masked areas and unmasked areas, the method comprising:

etching through unmasked areas of the hard mask layer and a predetermined amount of the doped silicon layer with a first etch;

removing the masked areas of the defined pattern;

resuming etching of the doped silicon layer until the insulating layer is exposed with a second etch; and over-etching the remaining doped silicon layer with a third etch until silicon residues are cleared.

2. The method of claim 1 wherein the silicon layer is selected from the group including poly-silicon and amorphous silicon.

3. The method of claim 1 wherein in the insulating layer is selected from the group including silicon-rich oxide, silicon dioxide.

4. The method of claim 1 wherein the silicon layer is doped wit carriers selected from the group including N-type and P-type.

5. The method of claim 1 wherein the gate stack is etched to a profile in the range of about 85° to 90°.

6. The method of claim 1 wherein the first etch removes about 60% to 70% of the doped silicon layer.

7. The method of claim 1 wherein the first etch comprises:

performing a breakthrough etch with a fluorine-containing gas selected from the group including $CF_4$ and $NF_3$; and performing a bulk etch with a gas mixture including $Cl_2$, HBr, and $CF_4$.

8. The method of claim 1 wherein removing the pattern defined in masked areas includes a wet-strip or ashing in an oxygen plasma.

9. The method of claim 1 wherein the second etch comprises, performing a breakthrough etch with a fluorine-containing gas selected from the group including $CF_4$ and $NF_3$; and performing an endpoint etch with a gas mixture including $Cl_2$, HBr, and 80%$HeO_2$.

10. The method of claim 1 wherein the third etch is a gas mixture including HBr, 80%$HeO_2$, and He.

11. The method of claim 1 wherein the hard mask layer includes silicon oxy-nitride.

12. The method of claim 9 wherein the endpoint etch has a silicon-to-gate oxide selectivity ratio of at least 190:1.

13. The method of claim 8 wherein the breakthrough etch is introduced into the etch chamber at a flow rate in the range of about 80 sccm to 120 sccm.

14. The method of claim 7 wherein the bulk etch gases are introduced into the etch chamber at flow rates of about 5–30 sccm for $Cl_2$, 50–150 sccm for HBr, and 5–50 sccm for $CF_4$.

15. The method of claim 9 wherein the endpoint etch gases are introduced into the etch chamber at flow rates of about 5–30 sccm for $Cl_2$, 50–200 sccm for HBr, and 5–30 sccm for 80%He—$O_2$.

16. The method of claim 10 wherein the third etch gases are introduced into the etch chamber at flow rates of about 100–300 sccm for HBr, 5–30 sccm for 80%He—$O_2$, and 100–500 sccm for He.

17. A method for etching a gate stack having an anti-reflective coating layer formed on a doped silicon layer on an insulating layer on a substrate, the anti-reflective coating layer having a pattern defined thereon, the pattern having masked areas and unmasked areas, the method comprising:

etching through unmasked areas of the anti-reflective coating layer and the majority of the doped silicon layer with a first etch;

removing the masked areas of the defined pattern on the anti-reflective coating layer, using the anti-reflective coating layer as a hard mask and resuming etching of the doped silicon layer until the insulating layer is exposed with a second etch; and over-etching the remaining doped silicon layer with a third etch until silicon residues are cleared.

18. The method of claim 17, wherein the first etch comprises, performing a first breakthrough etch with a fluorine-containing gas selected from the group including $CF_4$ and $NF_3$; and performing a bulk etch with a gas mixture including $Cl_2$, HBr, and $CF_4$;

wherein the second etch comprises, performing a second breakthrough etch with a fluorine-containing gas selected from the group including $CF_4$ and $NF_3$; and performing an endpoint etch with a gas mixture including $Cl_2$, HBr, and 80%$HeO_2$;

wherein the third etch comprises, performing an over-etch with a gas mixture including HBr, 80%$HeO_2$, and He.

19. The method of claim 18, wherein the breakthrough etch is introduced into the etch chamber at a flow rate in the range of about 80 sccm to 120 sccm;

wherein the bulk etch gases are introduced into the etch chamber at flow rates of about 5–30 sccm for $Cl_2$, 50–150 sccm for HBr, and 5–50 sccm for $CF_4$;

wherein the endpoint etch gases are introduced into the etch chamber at flow rates of about 5–30 sccm for $Cl_2$, 50–200 sccm for HBr, and 5–30 sccm for 80%He—$O_2$; and wherein third etch gases are introduced into the etch chamber at flow rates of about 100–300 sccm for HBr, 5–30 sccm for 80%He—$O_2$, and 100–500 sccm for He.

20. The method of claim 19 wherein the gate stack is etched to a profile in the range of about 85° to 90°.

* * * * *